United States Patent

Aoyama et al.

(10) Patent No.: US 9,891,128 B2
(45) Date of Patent: Feb. 13, 2018

(54) PRESSURE SENSOR HAVING A DIGITAL CIRCUIT UNIT CONNECTED TO ADJUSTMENT TERMINALS AND EARTH TERMINALS

(71) Applicant: FUJIKOKI CORPORATION, Tokyo (JP)

(72) Inventors: Tomohisa Aoyama, Tokyo (JP); Hiroshi Ito, Fukushima (JP); Motohisa Mukai, Tokyo (JP)

(73) Assignee: FUJIKOKI CORPORATION, Tokyo (JP)

( * ) Notice: Subject to any disclaimer, the term of this patent is extended or adjusted under 35 U.S.C. 154(b) by 105 days.

(21) Appl. No.: 14/684,494

(22) Filed: Apr. 13, 2015

(65) Prior Publication Data

US 2015/0300900 A1    Oct. 22, 2015

(30) Foreign Application Priority Data

Apr. 17, 2014    (JP) ................... 2014-085260

(51) Int. Cl.
*G01L 9/00* (2006.01)
*H01G 7/00* (2006.01)
*G01L 19/00* (2006.01)

(52) U.S. Cl.
CPC .......... *G01L 9/008* (2013.01); *G01L 19/0046* (2013.01); *H01L 2224/48091* (2013.01)

(58) Field of Classification Search
None
See application file for complete search history.

(56) References Cited

U.S. PATENT DOCUMENTS

| | | | | |
|---|---|---|---|---|
| 5,332,922 A * | 7/1994 | Oguchi | ...... | G11C 5/00 257/692 |
| 6,540,316 B1 * | 4/2003 | Imanaka | ...... | B41J 2/04515 347/14 |
| 6,855,893 B2 * | 2/2005 | Kumakura | ...... | H01L 23/3114 174/260 |
| 7,180,798 B2 * | 2/2007 | Nishikawa | ...... | G01D 3/022 327/356 |
| 8,030,746 B2 * | 10/2011 | Tan | ...... | G06K 19/072 257/686 |
| 8,077,439 B2 * | 12/2011 | Darabi | ...... | H01L 23/60 361/220 |

(Continued)

*Primary Examiner* — Peter Macchiarolo
*Assistant Examiner* — Jermaine Jenkins
(74) *Attorney, Agent, or Firm* — Bacon & Thomas, PLLC

(57) ABSTRACT

According to the invention, a pressure receiving space of a pressure sensor is prevented from being charged. In the pressure sensor, a diaphragm is mounted on a base fixed in a cover to form the pressure receiving space in which oil is sealed. A semiconductor pressure detection device is provided in the pressure receiving space, and adjustment lead pins and an earth-terminal lead pin are connected to terminals of the semiconductor pressure detection device by bonding wires. A wiring substrate is provided with the base of the pressure receiving space interposed and faces the base, and a metal foil is provided such that one or more lead pins of the adjustment lead pins and the earth-terminal lead pin are electrically connected in the wiring substrate. Therefore, the charging of the insulative medium sealed in the pressure receiving space is prevented.

6 Claims, 3 Drawing Sheets

(56) References Cited

U.S. PATENT DOCUMENTS

| | | | |
|---|---|---|---|
| 8,362,626 B2* | 1/2013 | Koike | H01L 23/4334 257/686 |
| 2014/0260648 A1* | 9/2014 | Aoyama | G01L 19/0046 73/725 |
| 2015/0177088 A1* | 6/2015 | Takatsuki | G01L 9/0022 73/723 |

* cited by examiner

PRESSURE SENSOR HAVING A DIGITAL CIRCUIT UNIT CONNECTED TO ADJUSTMENT TERMINALS AND EARTH TERMINALS

BACKGROUND OF THE INVENTION

1. Field of the Invention

The invention relates to a pressure sensor which is provided with a semiconductor pressure detection device.

2. Description of the Related Art

Such type of pressure sensor is built in a refrigerating apparatus or an air conditioner and used to detect a refrigerant pressure, or built in an industrial apparatus to detect various types of fluid pressures.

A semiconductor pressure detection device is disposed in a pressure receiving chamber which is partitioned by a diaphragm and is filled with oil, and has a function of converting a change in pressure in a pressure receiving space into an electric signal and outputting the electric signal to the outside. The diaphragm is made of a flexible metal plate, and when a potential difference with respect to a semiconductor pressure detection element is generated or the sealed oil is charged with static electricity, there may occur a defect in the semiconductor pressure detection element.

Therefore, JP 2003-302300 A discloses a technology in which a conductive member is disposed between the semiconductor pressure detection element and the diaphragm and the conductive member is connected to the zero potential of an electric circuit for the neutralization.

SUMMARY OF THE INVENTION

In the technology disclosed in JP 2003-302300 A, the conductive member (a neutralization plate) is disposed between the semiconductor pressure detection element and the diaphragm, so that there is a concern that a height dimension of the pressure receiving space becomes larger. In addition, the structure of the neutralization plate is also complicated. An object of the invention is to provide a pressure detection sensor which is required no neutralization plate and simplified.

In order to achieve the above object, a pressure sensor according to the invention includes a pressure detection element configured to include at least a digital circuit unit and a plurality of adjustment terminals and an earth terminal which are connected to the digital circuit unit. At least one of the adjustment terminals and the earth terminal are electrically connected.

Specifically, the pressure sensor according to the invention further includes a base configured to be provided with the pressure detection element, a diaphragm configured to receive a pressure of a fluid, adjustment lead pins configured to be electrically connected to the adjustment terminals of the pressure detection element, and one earth-terminal lead pin configured to be connected to zero potential of an electric circuit. The pressure detection element is provided in the pressure receiving space which is formed to seal an insulative medium such as oil between the base and the diaphragm. The respective lead pins are vertically provided in the base. At least one of the adjustment lead pins and the earth-terminal lead pin are electrically connected on the base.

Employing the configuration of the invention, it is possible to provide a pressure sensor which is simply configured without a neutralization plate and has a high reliability having a good resistance against an electromagnetic noise such as static electricity.

BRIEF DESCRIPTION OF THE DRAWINGS

FIGS. 2A to 2C are diagrams of the pressure sensor illustrated in FIG. 1 taken along a plane A-A depicted by arrows, in which FIG. 2A illustrates a state where the entire three adjustment lead pins are connected to an earth-terminal lead pin, FIG. 2B illustrates a state where two adjustment lead pins are connected to the earth-terminal lead pin, and FIG. 2C illustrates only one adjustment lead pin is connected to the earth-terminal lead pin.

DETAILED DESCRIPTION OF THE PREFERRED EMBODIMENTS

Figure 1:
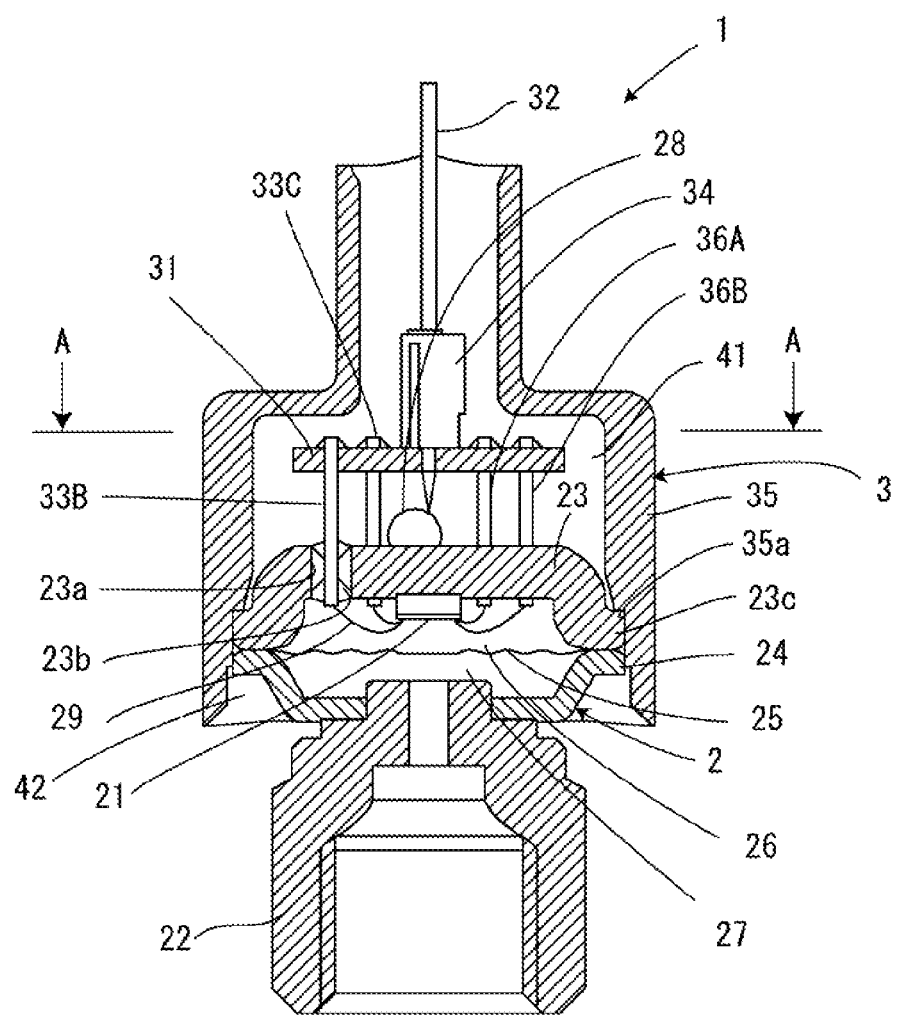
FIG. 1 is a vertical cross-sectional view of a pressure sensor in an embodiment of the invention.

As illustrated in FIG. 1, a pressure sensor 1 includes a stepped cylinder cover 35. In an opening of the cover 35 having a large diameter, there is mounted a semiconductor pressure detection device 2. The semiconductor pressure detection device 2 includes a base 23 which is provided with a pressure detection element 21 to be described below, a receiving member 24 which supports a fluid inflow section 22 connected to a fluid inflow pipe (not illustrated), and a diaphragm 25 of which the outer peripheral portion is interposed between the base 23 and the receiving member 24.

An insulative liquid medium such as oil fills a pressure receiving space 26 which is partitioned by the plate-like base 23 and the diaphragm 25. A ball 28 is used to seal a through hole (not illustrated) formed in the base 23 after the pressure receiving space 26 is filled with the liquid medium through the hole, and is fixed to the base 23 by welding.

The pressure detection element 21 (a pressure sensor chip (that is, an IC)) is mounted on the center portion on a side of the base 23 near the pressure receiving space 26. The pressure detection element 21 includes eight bonding pads (terminals) in this embodiment, in which three of them are sensor signal terminals (a power input terminal, an earth terminal, and a signal output terminal), other three are signal adjustment terminals, and the remaining two are EPROM write terminals.

Through holes 23a as many as the number of bonding pads are formed in the base 23 in the surrounding area of the pressure detection element 21, and a plurality ("8" in this embodiment) of lead pins are inserted in the through holes 23a. The lead pin is insulated and sealed with respect to the base 23 by a hermetic seal 23b and vertically disposed.

One of the lead pins is an earth terminal pin 33A. The other seven terminal pins and one earth terminal pin 33A are fixed to a wiring substrate 31. In addition, three lead pins 33A, 33B, and 33C connected to the earth terminal, the signal output terminal, and the power input terminal are connected to a lead line 32 through a connector 34. The lead line 32 includes a power input lead line, a signal output lead line, and an earth lead line, and is connected to an electric circuit (not illustrated) which is provided in a control panel of a refrigerating apparatus or an air conditioner where the pressure sensor 1 is provided.

Each bonding pad of the pressure detection element 21 and the corresponding lead pin are connected (wired) by a bonding wire.

After the above-mentioned pressure detection device 2 is disposed in the cover 35, a space 41 in the cover 35 is filled with a resin from an opening (where the lead line 32 is led out) having a small diameter of the cover 35 and the resin is solidified. Similarly, a space 42 is also filled with the resin, and is fixed to make the pressure detection device 2 not depart from the lower side of the cover 35 in FIG. 1. Therefore, the pressure detection device 2 is fixed into the cover 35.

For example, the pressure detection element 21 is a piezoelectric element. The piezoelectric element is a kind of ferroelectric element which generates a voltage when a force such as vibration or pressure is applied thereto, and in reverse, stretches when a voltage is applied thereto.

A fluid introduced through the fluid inflow section 22 enters a pressurizing space 27, and the diaphragm 25 is deformed by the pressure, so that the medium in the pressure receiving space 26 is pressurized.

The pressure detection element 21 detects a variation in pressure and converts the variation into an electric signal, and outputs the electric signal to the outside through the lead pin.

Figure 3:
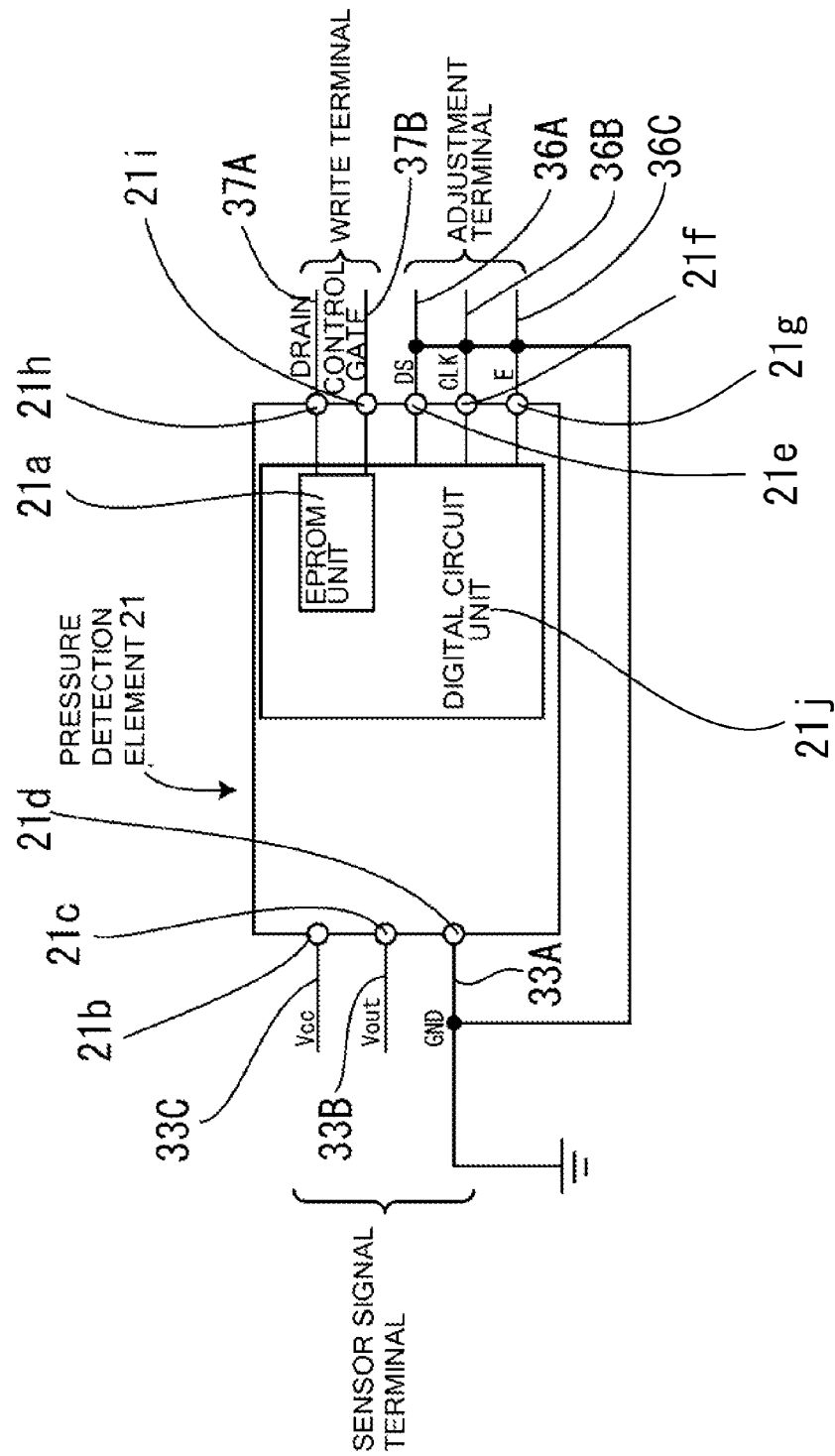
FIG. 3 is a circuit diagram illustrating an electrical configuration of the pressure sensor according to the invention.

As illustrated in FIG. 3, the pressure detection element 21 includes a digital circuit unit 21$j$, and the digital circuit unit 21$j$ is provided with an EPROM unit 21$a$. In addition, the pressure detection element 21 is provided with sensor signal terminals, adjustment terminals, and the EPROM write terminals. The sensor signal terminals include a Vcc terminal 21$b$ for inputting power, a Vout terminal 21$c$ for outputting a signal, and an earth terminal 21$d$ for the ground. In addition, the adjustment terminals include a DS terminal 21$e$ for inputting/outputting serial data, a CLK terminal 21$f$ for inputting clocks to a shift register, and an E terminal 21$g$ for controlling enable/disable of an adjustment signal. The EPROM write terminals include a control gate terminal 21$i$ and a drain terminal 21$h$.

Figure 2A:
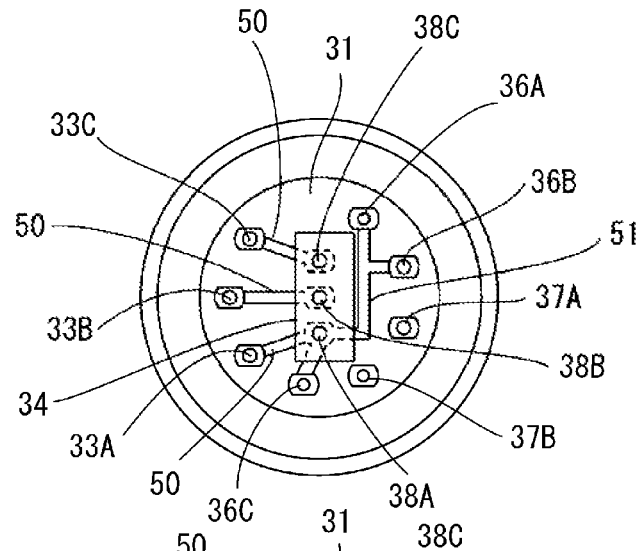
Figure 2B:
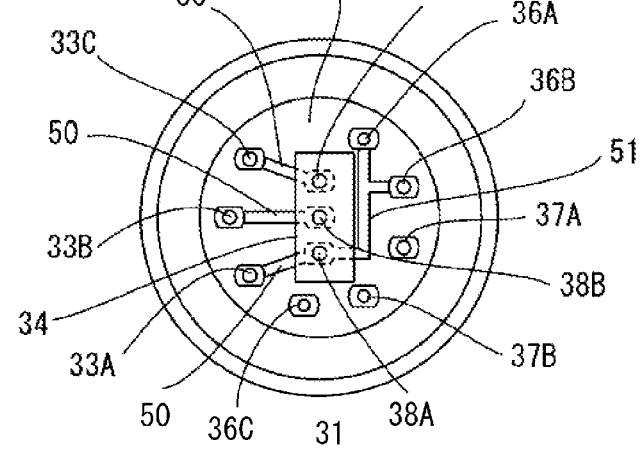
Figure 2C:
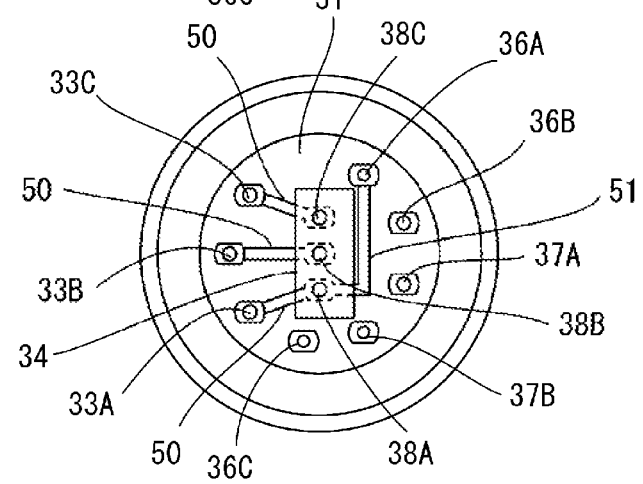

FIGS. 2A to 2C are diagrams taken along a plane A-A in FIG. 1 depicted by arrows. The respective terminals of the pressure detection element 21 are electrically connected to eight lead pins inserted in the through hole 23$a$ formed in the base 23 through bonding wires 29. The lead pins include three output lead pins (a lead pin 33A for an earth terminal, a lead pin 33B for outputting a signal, and a lead pin 33C for inputting power; hereinafter, these three lead pins 33A to 33C are collectively referred to as the output lead pin), also three adjustment lead pins (a lead pin 36A for a serial data input/output terminal, a lead pin 36B for a clock input terminal of a shift register, and a lead pin 36C for an enable terminal; hereinafter, these three lead pins 36A to 36C are collectively referred to as the adjustment lead pin), and two EPROM write lead pins (a lead pin 37A for an EPROM drain and a lead pin 37B for an EPROM control gate; hereinafter, these two lead pins 37A and 37B are collectively referred to as the EPROM write lead pin). The output lead pin is used to output the electric signal according to a pressure detected by the pressure detection element 21 to the outside, and the adjustment lead pin and the EPROM write lead pin are used to correct a voltage at the time of performing a manufacturing process as described above.

The connector 34 includes an earth connection terminal 38A which is electrically connected to the earth lead line, the power input lead line, the signal output lead line, a power input connection terminal 38C, and a signal output connection terminal 38B, and is mounted on a substrate 31.

In addition, the output lead pin (33A to 33C), the adjustment lead pin (36A to 36C), and the EPROM write lead pin (37A and 37B) have the upper ends fixed to the substrate 31 after the data for the voltage correction at the time of performing the manufacturing process is written to the EPROM 21$a$ using the adjustment lead pin and the EPROM write lead pin. Three wiring patterns 50 made of metal foils are formed to connect and fix the output lead pins 33A to 33C each on the surface of the substrate 31. These three wiring patterns 50 are formed to connect the respective output lead pins 33A to 33C and three external output lead lines 32 connected to the substrate 31 through the connector 34.

In the embodiment illustrated in FIG. 2A, a metal foil 51 is formed to fix the adjustment lead pins 36A, 36B, and 36C to the substrate 31 and to be electrically connected to the earth connection terminal 38A. In addition, the EPROM write lead pin (37A and 37B) is insulated without being connected to the other lead pins only by being fixed to the substrate 31. The earth connection terminal 38A is used to be connected through the lead line 32 to the zero potential of the electric circuit provided in the control panel such as the refrigerating apparatus or the air conditioner where the pressure sensor 1 is provided. In other words, the configuration illustrated in FIG. 2A is made to enable three adjustment terminals 21$e$, 21$f$, and 21$g$ provided in the pressure detection element 21 to be connected to the zero potential. Signals input to the digital circuit unit 21$j$ through the adjustment terminals 21$e$ to 21$g$ are appropriately processed, and written to the EPROM 21$a$ through the control gate terminal 21$i$ and the drain terminal 21$h$ of the EPROM write terminal. After the writing is ended, the adjustment terminals 21$e$ to 21$g$ are connected to the substrate 31, the terminals 21$e$ to 21$g$ are connected to the earth connection terminal 38A, but thereafter even a potential is applied to the terminals 21$e$ to 21$g$ or even "0" potential is applied, the data written in the EPROM 21$a$ is not deleted. Thereafter, even when the insulative medium sealed in the pressure receiving space 26 is charged, the charged potential can be zero from the adjustment lead pins 36A, 36B, and 36C through the metal foil 51 and from the earth connection terminal 38A through the lead line 32, so that it is possible to reliably neutralize the inside of the pressure receiving space 26. In addition, the data stored in the EPROM 21$a$ is not deleted.

According to the above-mentioned embodiment of the invention, it is possible to reliably prevent a defective operation of the pressure detection element 21 and the digital circuit unit 21$j$ included in the pressure detection element 21 by effectively removing the charges in the pressure receiving space 26.

Hitherto, the description has been made about the embodiment of the invention, but the invention is not limited to the above-mentioned embodiment, and various modifications can be made within a scope not departing from the spirit of the invention. For example, as an embodiment, the description has been made about the configuration in which the connection is made to the earth connection terminal 38A from the adjustment lead pins 36A, 36B, and 36C through the metal foil 51 as illustrated in FIG. 2A, but the connection may be made to the earth connection terminals 38A from only two adjustment lead pins 36A and 36B as illustrated in FIG. 2B, or the connection may be made to the earth connection terminal 38A from only one adjustment lead pin 36A as illustrated in FIG. 2C. In addition, the invention is not limited to the above configurations, and any configuration may be employed as long as any combination of at least one or more pins selected from the adjustment lead pins 36A, 36B, and 36C are connected to the earth connection terminal 38A. In addition, the lead pins which are not necessarily connected to the earth connection terminal 38A among the EPROM write lead pins and the adjustment lead pins have been simply described to be fixed to the substrate 31, but these lead pins are not particularly needed to be fixed to the substrate 31. In a case where the lead pins are not necessarily fixed, it is possible to reduce a cost and save a space by cutting out the peripheral edge portions of the substrate corresponding to these lead pins.

What is claimed is:

1. A pressure sensor comprising:
a pressure detection element configured to include at least a digital circuit unit and a plurality of adjustment terminals and an earth terminal which are connected to the digital circuit unit,
wherein at least one of the adjustment terminals and the earth terminal are electrically connected,
said pressure sensor, further comprising:
a base configured to be provided with the pressure detection element;
a diaphragm configured to receive a pressure of a fluid,
wherein the pressure detection element is provided in the pressure receiving space which is formed to seal an insulative medium between the base and the diaphragm;
adjustment lead pins configured to be electrically connected to the adjustment terminals of the pressure detection element; and
one earth-terminal lead pin configured to be connected to zero potential of an electric circuit,
wherein the respective lead pins are vertically provided in the base, and
wherein at least one of the adjustment lead pins and the earth-terminal lead pin are electrically connected on the base.

2. The pressure sensor according to claim 1, further comprising:
a substrate,
wherein at least one of the adjustment lead pins and the earth-terminal lead pin are electrically connected on the substrate.

3. The pressure sensor according to claim 1,
wherein one adjustment terminal of the plurality of adjustment terminals and the earth terminal are electrically connected.

4. The pressure sensor according to claim 1,
wherein two adjustment terminals of the plurality of adjustment terminals and the earth terminal are electrically connected.

5. The pressure sensor according to claim 1,
wherein all the plurality of adjustment terminals and the earth terminal are electrically connected.

6. The pressure sensor according to claim 1, wherein the at least one of the adjustment terminals and the earth terminal are directly and electrically connected by a metal foil.

* * * * *